(12) United States Patent
Lee

(10) Patent No.: US 6,564,287 B1
(45) Date of Patent: May 13, 2003

(54) SEMICONDUCTOR MEMORY DEVICE HAVING A FIXED CAS LATENCY AND/OR BURST LENGTH

(75) Inventor: Jung-Bae Lee, Suwon (KR)

(73) Assignee: Samsung Electronics Co., Ltd. (KR)

( * ) Notice: Subject to any disclaimer, the term of this patent is extended or adjusted under 35 U.S.C. 154(b) by 175 days.

(21) Appl. No.: 09/655,643

(22) Filed: Sep. 5, 2000

(30) Foreign Application Priority Data

Aug. 18, 2000 (KR) .............................................. 00-47907

(51) Int. Cl.[7] .......................... G06F 13/00; G06F 13/28; G11C 11/4076
(52) U.S. Cl. ........................ 711/105; 711/167; 711/169; 710/35; 365/233; 365/238.5
(58) Field of Search ................................. 711/104, 105, 711/167, 169; 710/35, 61; 365/233, 238.5

(56) References Cited

U.S. PATENT DOCUMENTS

| | | | |
|---|---|---|---|
| 5,544,124 A | * 8/1996 | Zagar et al. | 365/233 |
| 5,568,445 A | * 10/1996 | Park et al. | 365/233 |
| 5,923,595 A | * 7/1999 | Kim | 365/233 |
| 5,986,918 A | * 11/1999 | Lee | 365/233 |
| 6,064,627 A | * 5/2000 | Sakurai et al. | 365/233 |
| 6,101,136 A | * 8/2000 | Mochida | 365/194 |
| 6,104,668 A | * 8/2000 | Lee et al. | 365/233 |
| 6,185,149 B1 | * 2/2001 | Fujioka et al. | 365/233 |
| 6,185,637 B1 | * 2/2001 | Strongin et al. | 710/35 |
| 6,337,833 B1 | * 1/2002 | Kanazashi et al. | 365/233 |
| 6,392,909 B1 | * 5/2002 | Jang et al. | |

FOREIGN PATENT DOCUMENTS

JP    10-208468    * 8/1998

OTHER PUBLICATIONS

Choi et al, "16–Mb Synchronous DRAM With 125–Mbyte/5 Data Rate," IEEE Jour. of Solid State Circuits, vol. 29, No. 4, Apr. 1994, pp. 529–533.*

* cited by examiner

*Primary Examiner*—Glenn Gossage
(74) *Attorney, Agent, or Firm*—F. Chau & Associates, LLP

(57) ABSTRACT

A semiconductor memory device is provided in which a burst length and/or a column address strobe (CAS) latency may be fixed. The semiconductor memory device, which may be an SDRAM (synchronous dynamic random access memory) device, includes a memory cell array, a burst address generation circuit to generate a burst address and a burst length detection signal, a mode setting register for setting a CAS latency and/or a burst length using an address, a pipeline circuit to delay and output data read from the memory cell array. The semiconductor memory device also includes a latency enable control signal generation circuit to generate a latency enable control signal in response to a read command or signal and the burst length detection signal, and a data output circuit to output data being output from the pipeline circuit in response to the latency enable control signal. Therefore, a circuit configuration is simplified and a test time is reduced, by fixing latency and/or burst length.

17 Claims, 14 Drawing Sheets

SEMICONDUCTOR MEMORY DEVICE HAVING A FIXED CAS LATENCY AND/OR BURST LENGTH

BACKGROUND OF THE INVENTION

1. Field of the Invention

The present invention relates to a semiconductor memory device, particularly to a semiconductor memory device comprising a fixed latency operation mode and/or a fixed burst operation mode.

2. Discussion of Related Art

A conventional semiconductor memory device performing latency and burst operation is designed to perform each of variable operation modes of latency 1, 2, 3, and variable operation modes of burst length 1, 2, 4 and 8.

Here, a latency operation refers to a CAS (column address strobe) latency operation, which is a time delay between the time that effective data is output and the time a read command or signal is applied. CAS latency is given as n clock cycles (where n is an integer). For example, if latency is set at 3, data will be output from a semiconductor device 3 clock cycles after a read command or signal is applied to the semiconductor memory device.

The latency operation of a synchronous dynamic random access memory (SDRAM) is different from that of a double data rate synchronous dynamic random access memory (DDR SDRAM). That is, in case of a SDRAM, if latency is set at n, data is output after being delayed for (n−1)tck(clock cycle)+tsac(a delay time from a clock signal generation to the time when effective data is output) after a read command or signal is input. In case of a DDR SDRAM, data is output after being delayed for ntck(clock cycle)+tsac(a delay time from a clock signal generation to the time when effective data is output) after a read command or signal is input.

A burst operation refers to a situation when a column address is input after a row address is input, and data as to continuous column addresses thereafter is output at high speed in synchronization with a clock signal. For example, if burst length is set at 4, a semiconductor memory device outputs 8 data in synchronization with the clock signal if a column address is input from an external source. Typically, if a column address is input once from the external source, the next 7 column addresses are generated internally by a column address generation circuit.

A conventional semiconductor memory device is usually designed to operate at various latency levels and burst lengths. But, in general, if a semiconductor memory device is used in one system, it operates only in one mode. A semiconductor memory device in a conventional computer typically sets CAS latency at 2 and burst length at 4. Therefore, in most cases, there is no need for designing a semiconductor memory device to perform latency at different levels and burst operations at different lengths.

In order to perform various latency and burst operations like the prior semiconductor memory device, a circuit configuration has to be added internally, and also, when testing the device, the test should be performed in all possible cases of operable latency levels and burst lengths. Consequently, the cost of the device is increased and the test time is increased.

Before describing embodiments of semiconductor memory devices of the present invention, a conventional semiconductor memory device will be described.

FIG. 1 is a block diagram showing a configuration of an embodiment of a conventional semiconductor memory device, comprising a memory cell array 10, an address buffer 12, a row address decoder 14, column selection switches 16-1, 16-2, . . . and 16-m, a write data amplifier 18, a sense amplifier 20, a column address decoder 22, a mode setting register 24, a burst address generation circuit 26, a pipeline control signal generation circuit 28, a pipeline circuit 30, a latency enable control signal circuit 32, and a data output driver 34.

A configuration of each block shown in FIG. 1 will now be described in detail. The memory cell array 10 comprises a plurality of memory cells MC connected between n word lines WL1, WL2, . . . , and WLn and m bit line pairs BL1 and BL1B, BL2 and BL2B, . . . ,and BLm and BLmB respectively. The address buffer 12 buffers and outputs an address Ai applied from an external source. The row address decoder 14 generates n word line selection signals WL1, WL2, . . . , and WLn by decoding buffered addresses output from the address buffer 12. The column selection switches 16-1, 16-2, . . . ,and 16-m operate between bit line pairs BL1 and BL1B, BL2 and BL2B, . . . ,and BLm and BLmB and a data input/output line pair IO and IOB by being turned on in response to each of column selection signals Y1, Y2, . . . and Ym. The write data amplifier 18 amplifies and transmits data DI input from the external source to the data input/output line pair IO and IOB.

The sense amplifier 20 amplifies data transmitted from the data input/output line pair IO and IOB. The column address decoder 22 generates the column selection signals Y1, Y2, . . . , and Ym by decoding a burst address PCAj. The mode setting register 24 generates burst length control signals BL1, 2, 4 and 8 and latency control signals CL1, 2 and 3 by receiving address Ai in response to a mode setting control signal PMRS. For setting latency level and burst length, the inputted address Ai is inputted through address input pins (not shown). The burst address generation circuit 26 receives a column address in response to a read signal PC and a clock signal CLK, and generates burst addresses starting from the column address in response to the clock signal CLK, and generates burst addresses in lengths corresponding to the burst length control signals BL1, 2, 4 and 8, and generates a burst length detection signal COSI when the generation of burst addresses is completed. The pipeline control signal generation circuit 28 is enabled in response to the read signal PC and generates pipeline control signals p1, p2 and p3 by delaying the clock signal CLK in response to the latency control signals CL1, 2 and 3. The pipeline circuit 30 delays and outputs a signal from the sense amplifier 20 in response to the pipeline control signals p1, p2 and p3.

The latency enable control circuit 32 generates a latency enable control signal in response to the read signal PC and the burst length detection signal COSI, and delays the latency enable control signal for 1 cycle and 2 cycles in response to the clock signal CLK, and outputs a latency signal, a 1 cycle-delayed latency control signal, or a 2 cycle-delayed latency control signal as a latency enable control signal LA. The data output driver 34 outputs data DO by being enabled in response to the latency enable control signal. The block diagram of an embodiment shown in FIG. 1 is a configuration inputting/outputting 1 bit data, and the number of bits of input/output data can be extended.

FIG. 2 is a block diagram of an embodiment of a burst address generation circuit shown in FIG. 1, which comprises a burst address counter 40, a burst length counter 42, a burst length detector 44 and a counter reset circuit 46. Details of the operation of each block shown in FIG. 2 will now be described.

The burst address counter 40 receives a column address CAi in response to the read signal PC and outputs a burst address PCAj. The burst address counter 40 further generates addresses, counting up from the input column address CAi in response to the clock signal CLK and outputs the addresses as the burst address PCAj. The burst length counter 42 is operated in response to the read signal PC and generates a signal CNT, counting in response to the clock signal CLK. The burst length detector 44 generates a burst length detection signal COSI if the burst length control signal BL1, 2, 4 and 8 coincides with the signal CNT by comparison. The counter reset circuit 46 is enabled in response to the read signal PC, and generates a reset signal PCAR. The reset signal PCAR is enabled in response to the read command or signal PC and disabled when the burst length detection signal COSI is generated. Then, the generated reset signal PCAR is used to reset counters 40 and 42.

FIG. 3 is a block diagram of an embodiment of the pipeline control signal generation circuit shown in FIG. 1, illustrating buffers 50 and 52, and logic and delay circuits 54 and 56. Details of the operation of each block shown in FIG. 3 will now be described.

A buffer 50 generates a clock signal PCLK by buffering a clock signal CLK applied from the external source. A buffer 52 is enabled in response to the read signal PC and generates a pipeline control signal p3 by buffering the clock signal CLK applied from the external source. The generated pipeline control signal p3 at that time is a signal, which is generated by buffering the clock signal CLK applied from the external source after the read signal PC is generated. A logic and delay circuit 54 is enabled in response to the read signal PC, and generates a logic low level pipeline control signal p1 by delaying the clock signal CLK in response to a latency control signal CL3, and generates a logic high level pipeline control signal p1 in response to the latency control signal CL1 and CL2. A logic and delay circuit 56 is enabled in response to the read signal PC, and generates a logic low level pipeline control signal p2 by delaying the pipeline control signal p3 in response to the latency signal CL3, and generates a logic high level pipeline control signal p2 in response to the latency control signal CL1.

According to the latency control signal generation circuit shown in FIG. 3, the logic and delay circuits 54, 56 generate logic high level latency control signals p1 and p2 when the latency control signal CL1 is generated. The buffer 52 generates the pipeline control signal p3 by buffering the clock signal CLK applied from the external source. If the latency control signal CL2 is generated, the logic and delay circuit 56 generates the logic high level latency control signal p2, and the buffer 52 and the logic and delay circuit 54 generate pipeline control signals p3 and p1 respectively.

FIG. 4 is a configuration of an embodiment of a pipeline circuit 30 shown in FIG. 1, which comprises three D flip flops 60, 62 and 64. The operation of the circuit shown in FIG. 4 will now be described.

If latency CL is set at 1, the pipeline control signals p1 and p2 are fixed at logic high level, and D flip flops 60 and 62 transmit its own input signal IN as it is, and the D flip flop 64 latches an output signal of the D flip flop 62 in response to the pipeline control signal p3 and generates an output signal OUT. That is, the input signal IN is delayed one cycle and then outputted.

If latency is set at 2, the pipeline control signal p2 is fixed at logic high level, and the D flip flop 62 transmits its own input signal as it is, the D flip flop 60 latches and outputs its own input signal IN in response to the pipeline control signal p1. The D flip flop 64 latches the output signal of the D flip flop 62 in response to the pipeline control signal p3 and outputs an output signal OUT. That is, the input signal IN is delayed two cycles and then outputted by the D flip flops 60 and 64.

If latency is set at 3, all pipeline control signals p1, p2, and p3 are generated (not fixed "high"), and the D flip flops 60, 62 and 64 latches its own input signal, respectively, and thus generate the output signal OUT by delaying the input signal IN three cycles in response to the pipeline control signals p1, p2 and p3.

FIG. 5 is a configuration of an embodiment of the latency enable control signal generation circuit 32 shown in FIG. 1, which comprises a set-reset (SR) flip flop 70, D flip flops 72 and 74, and a multiplexer 76. The operation of each block shown in FIG. 5 will be described as follows.

The SR flip flop 70 is enabled in response to the read signal PC and generates a first latency signal LA1, which is reset in response to the burst length detection signal COSI. The D flip flop 72 generates a second latency signal LA2 by delaying the first latency signal LA1 one cycle in response to the clock signal CLK. The D flip flop 74 generates a third latency signal LA3 by delaying the second latency signal LA2 one cycle in response to the clock signal CLK. The multiplexer 76 generates the first, the second, and the third latency signals LA1, LA2, and LA3 as a latency enable signal LA in response to each of the latency enable control signals CL1, CL2, and CL3.

FIG. 6 is a timing diagram illustrating the operation of an embodiment of the semiconductor memory device shown in FIG. 1, which is for illustrating the operation in case that latency CL is set at 3 and the burst length BL at 4. The operation of the semiconductor memory device will be described as follows using the timing diagram shown in FIG. 6.

If an address Ai is applied together with a mode register setting control command or signal PMRS, the semiconductor memory device stores the address Ai in the mode setting register 24 responding to the mode register setting control command or signal PMRS, and generates latency signals CL1, CL2, and CL3 and burst length control signals BL1, BL2, BL4, and BL8 internally. Then, the applied address Ai is a signal not for accessing the memory cell array 10 but for setting the operation mode.

If a row address RA is applied together with an active command or signal ACT two cycles after the mode register setting control command or signal PMRS is applied, the semiconductor memory device selects one word line among n word lines WL1, WL2, . . . , and WLn of the memory cell array 10.

If a column address CA is applied together with the read command or signal RD three cycles after the active command or signal ACT is applied, the semiconductor memory device generates a read signal PC internally. And, the burst address generation circuit 26 generates four burst addresses PCAj starting from the buffered column address outputted from the address buffer 12 in response to the burst length control signal BL4, and generates a burst length detection signal COSI if the generation of burst addresses is ended. The column address decoder 22 generates column selection signals Y1, Y2, Y3 and Y4 in sequence by decoding the address PCAj. The timing diagram of FIG. 6 is shown under the assumption that the burst address is an address increasing from the inputted column address in sequence.

The column selection switches 16-1, 16-2, . . . , and 16-m transmit data of bit line pairs BL1 and BL1B, BL2 and BL2B, . . . , and BLm and BLmB to the data input/output line pair IO and IOB respectively in response to each of column selection signals Y1, Y2, Y3 and Y4. If the read signal PC is generated, the counter reset signal PCAR is enabled, and if the generation of column selection signals Y1, Y2, Y3 and Y4 is ended, the counter reset signal PCAR is disabled. If generation of the column selection signals Y1, Y2, Y3 and Y4 is ended, the burst length detection signal COSI is generated. The latency enable control signal generation circuit 32 generates a first latency signal LA1, which is enabled in response to the read signal PC and is disabled in response to the burst length detection signal COSI, and generates a third latency signal LA3 by delaying the first latency control signal LA1 two cycles in response to the clock signal CLK. It also generates the third latency signal LA3 as a latency enable control signal LA1 in response to the latency control signal CL3. The pipeline control signal generation circuit 28 generates pipeline control signals p1, p2 and p3 in response to the latency control signal CL3.

The pipeline circuit 30 generates a first output signal FDO in response to the pipeline control signal p1, and generates a second output signal SDO in response to the pipeline control signal p2, and generates a signal OUT in response to the pipeline control signal p3. The generated signal OUT at that time is generated as data output signals D01, D02, D03, and D04 by being delayed through the data output driver 34. With this method, the operation of the semiconductor memory device whose latency is fixed at 3 and burst length at 4 is performed.

FIG. 7 is a timing diagram showing the operation of another embodiment of the semiconductor memory device shown in FIG. 1, illustrating the operation in case that CAS latency CL is set at 2 and burst length BL at 4. The operation of the semiconductor memory device will be described as follows using the operation timing diagram shown in FIG. 7.

The operation time until the read signal PC and the column selection signals Y1, Y2, Y3, and Y4 are generated and data is outputted from bit line pairs BL1 and BL1B, BL2 and BL2B, . . . , and BLm and BLmB to the data input/output line pair IO and IOB in response to each of the column selection signals Y1, Y2, Y3, and Y4, after the read command or signal RD is applied, and the operation time until the burst length detection signal COSI and the counter reset signal PCAR are generated, are the same time period as shown in timing diagram of FIG. 6.

The latency enable control signal generation circuit 32 generates a second latency signal LA2 (shown as latency enable control signal LA) by delaying a first latency signal LA1 one cycle in response to the clock signal CLK. The pipeline control signal generation circuit 28 generates a pipeline control signal p1 by delaying the clock signal CLK, being enabled in response to the read signal PC, and the pipeline circuit 30 outputs data FDO in response to the pipeline control signal p1 by receiving data from the sense amplifier 20. And, the pipeline circuit 30 outputs data FDO as data SDO in response to the "high" level pipeline control signal p2, and outputs data SDO as data OUT in response to the pipeline control signal p3. The data OUT generated at that time is output as data DO by being delayed through the data output driver 34. With this method, the operation of the semiconductor memory device whose latency CL is fixed at 2 and burst length at 4 is performed.

The above-described prior semiconductor memory device, which comprises the mode setting register 24, the burst address generation circuit 26, the pipeline control signal generation circuit 28, the pipeline circuit 30, and the latency enable control signal generation circuit 32 is incapable of performing the operation in a case where CAS latency CL is set at 3 and burst length BL at 8. In addition, the prior semiconductor memory device increases test time and thus reduces the productivity because test is required for all modes of operations. And, the prior semiconductor memory device should perform the operation of applying the mode register setting command or signal before an active command or signal is applied to set latency and burst length during operation.

SUMMARY OF THE INVENTION

The present invention is directed to a semiconductor memory device that comprises a simple circuit configuration to provide a fixed latency and/or burst length mode of operation.

A semiconductor device according to the present invention also provides a reduction in test time by providing a fixed latency and/or burst length mode of operation.

According to an embodiment of the present invention, a semiconductor memory device comprises a memory cell array, burst address generation means to generate a burst address and a burst length detection signal by receiving an address, pipeline means to delay and output data that is read from the memory cell array, latency enable control signal generation means to generate a latency enable control signal in response to a read command or signal and the burst length detection signal, and data output means to output data from the pipeline circuit in response to the latency enable control signal. The burst address generation means generates burst addresses according to a fixed burst length, which is a time until data, which is read from the memory cell array in response to the burst address after the read command or signal is applied, is outputted through the pipeline circuit and the data output circuit. The burst length is fixed at n (n is integer), indicating n times as long as a cycle of a clock signal applied from the external source.

According to another embodiment of the present invention, a semiconductor memory device comprises a memory cell array, a mode setting register to store a mode setting command or signal applied from the external source to set a burst length and to generate a burst length control signal, burst address generation means to generate a burst address and a burst length detection signal in response to the burst length control signal by receiving an address, pipeline means to delay and output data that is read from the memory cell array, latency enable control signal generation means to generate a latency enable control signal in response to a read command or signal and the burst length detection signal, and data output means to output data from the pipeline circuit in response to the latency enable control signal. A time is counted until data, which is read from the memory cell array in response to the burst address after the read command or signal is applied, is outputted through the pipeline circuit and the data output circuit. The time is fixed at n (n is integer), indicating n times as long as a cycle of a clock signal applied from the external source.

According to a further embodiment of the present invention, a semiconductor memory device comprises a memory cell array, a mode setting register to store a mode setting command or signal applied from the external source to set latency and to generate a latency control signal, burst address generation means to generate a burst address and a burst length detection signal of fixed length by receiving an address, pipeline means to delay and output data that is read from the memory cell array in response to the latency control signal, latency enable control signal generation means to generate a latency enable control signal in response to a read command or signal, the burst length detection signal and the latency control signal, and data output means to output data from the pipeline circuit in response to the latency enable control signal.

Therefore, according to a semiconductor memory device of the present invention, a circuit configuration is simplified and the product cost is reduced in terms of fixing latency and/or burst length, and there is no necessity for further setting latency CL and burst length BL during operation.

Also, because there is no necessity for testing varying CAS latency CL and burst length BL during test in the semiconductor memory device of the present invention, the test time is reduced, and accordingly the productivity is improved.

BRIEF DESCRIPTION OF THE DRAWINGS

Further objects and advantages of the invention can be understood in more detail from the following descriptions taken in conjunction with the accompanying drawings in which.

DETAILED DESCRIPTION OF PREFERRED EMBODIMENTS

Figure 8:
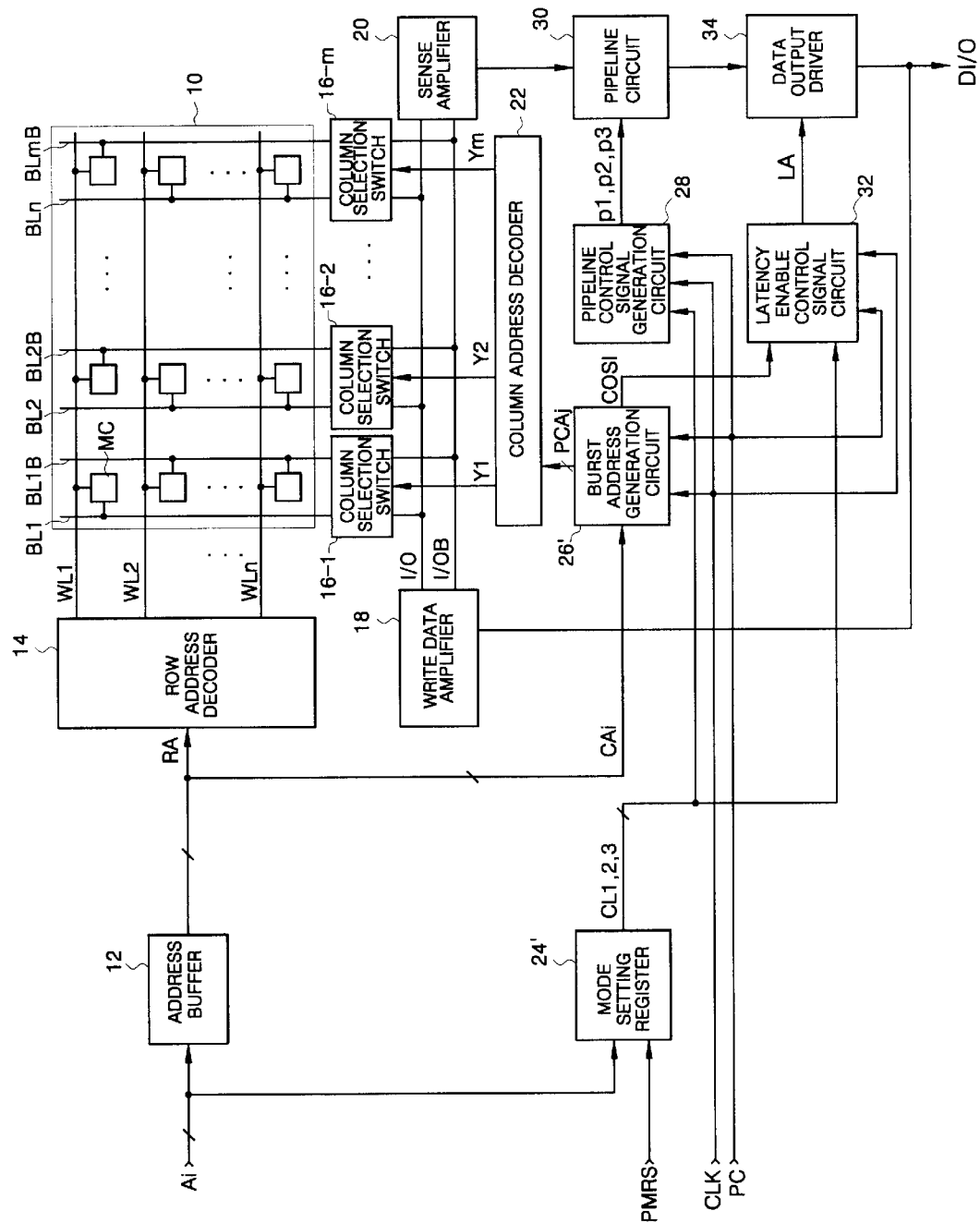
FIG. 8 is a block diagram showing a configuration of an embodiment of a semiconductor memory device of the present invention.

FIG. 8 is a block diagram showing an embodiment of a semiconductor memory device according to the present invention, having a variable CAS latency operation (or CL operation) and a fixed burst length BL, wherein BL is fixed at 4.

Figure 1:
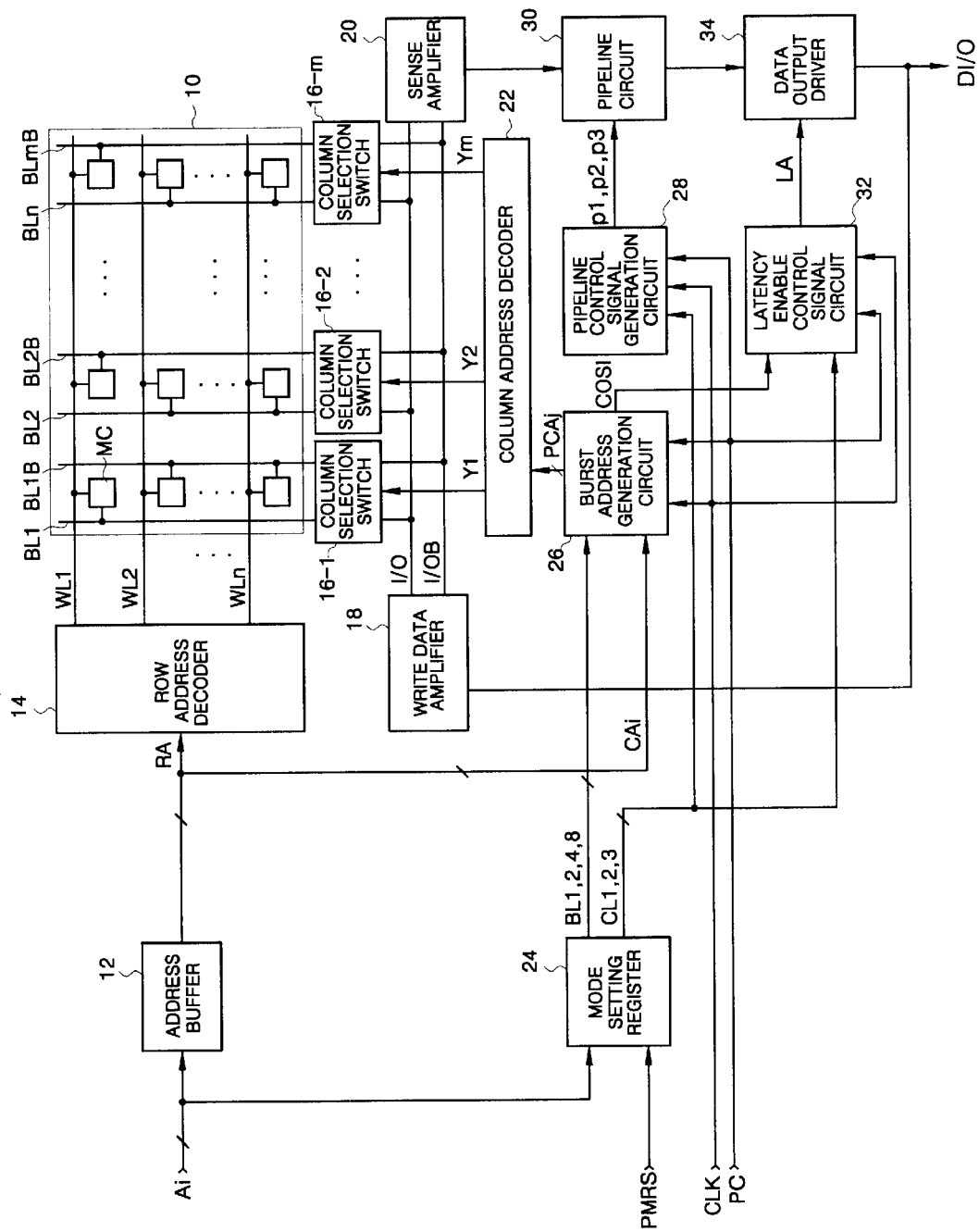
FIG. 1 is a block diagram showing a configuration of an embodiment of a conventional semiconductor memory device.

The semiconductor memory device shown in FIG. 8 has a mode setting register 24' and a burst address generation circuit 26' whose circuit configurations differ from those of the mode setting register 24 and the burst address generation circuit 26 of the conventional semiconductor memory device shown in FIG. 1. The configuration of other blocks shown in FIG. 8 is the same as that of blocks having the same numeric designations of the semiconductor memory device shown in FIG. 1.

In FIG. 8, the mode setting register 24' stores a command or signal to set CAS latency CL using address Ai in response to the mode setting register control command or signal PMRS. That is, it only has to store a command or signal applied from the external source to set CAS latency CL, and has no necessity for storing a command or signal to set burst length BL. Therefore, the circuit configuration constructing the mode setting register 24' is simplified.

Figure 9:
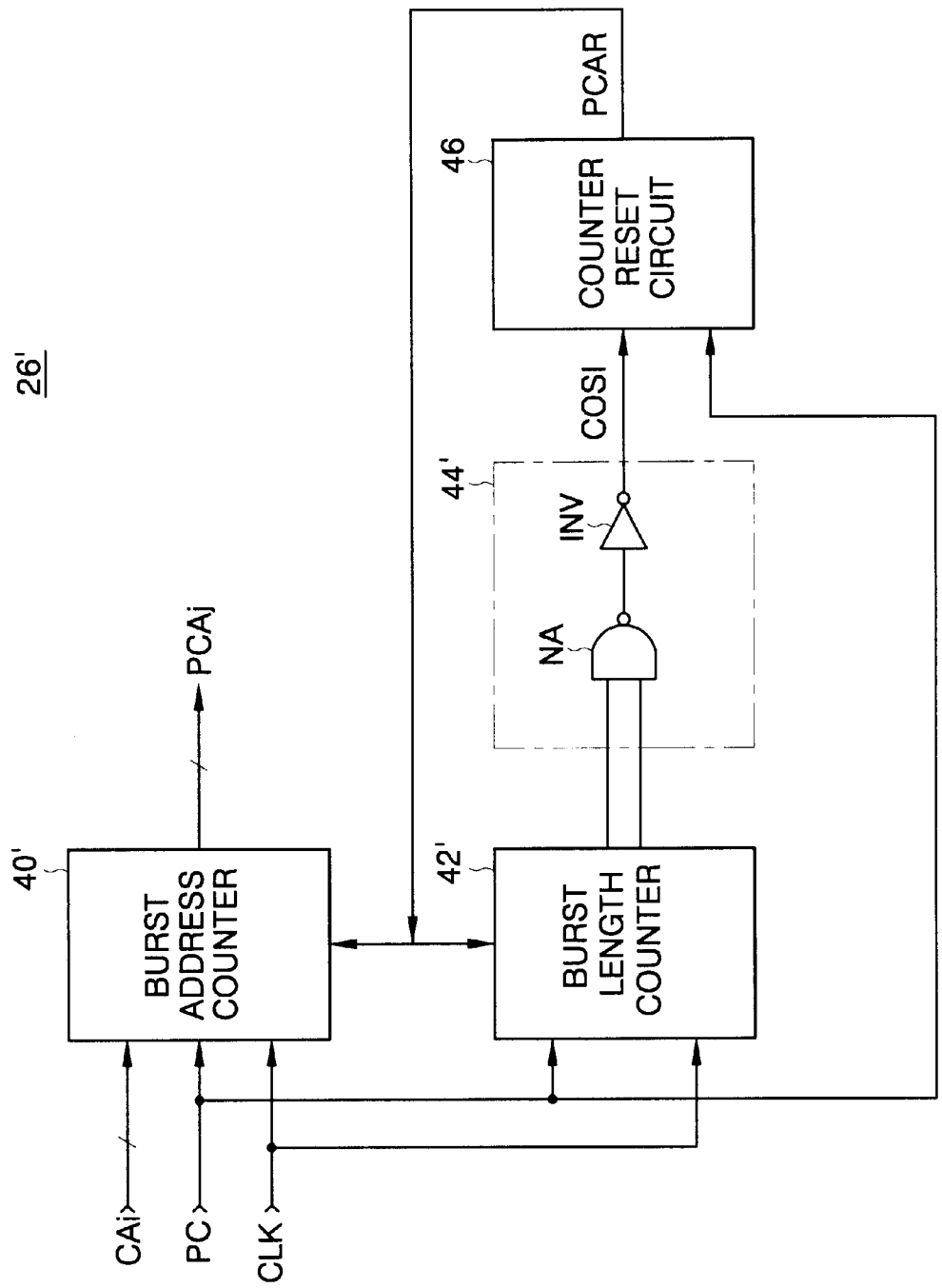
FIG. 9 is a block diagram of an embodiment of a burst address generation circuit shown in FIG. 8.

FIG. 9 is a block diagram of an embodiment of the burst address generation circuit 26' shown in FIG. 8, which comprises a burst address counter 40', a burst length counter 42', a burst length detector 44' and a counter reset circuit 46. The burst address generation circuit 26' shown in FIG. 9 shows a circuit configuration in case the burst length is fixed at 4, wherein the burst address counter 40' and the burst length counter 42' respectively comprise a 2 bit counter, and the burst length detector 44' comprises an NAND gate NA and an inverter INV.

Figure 2:
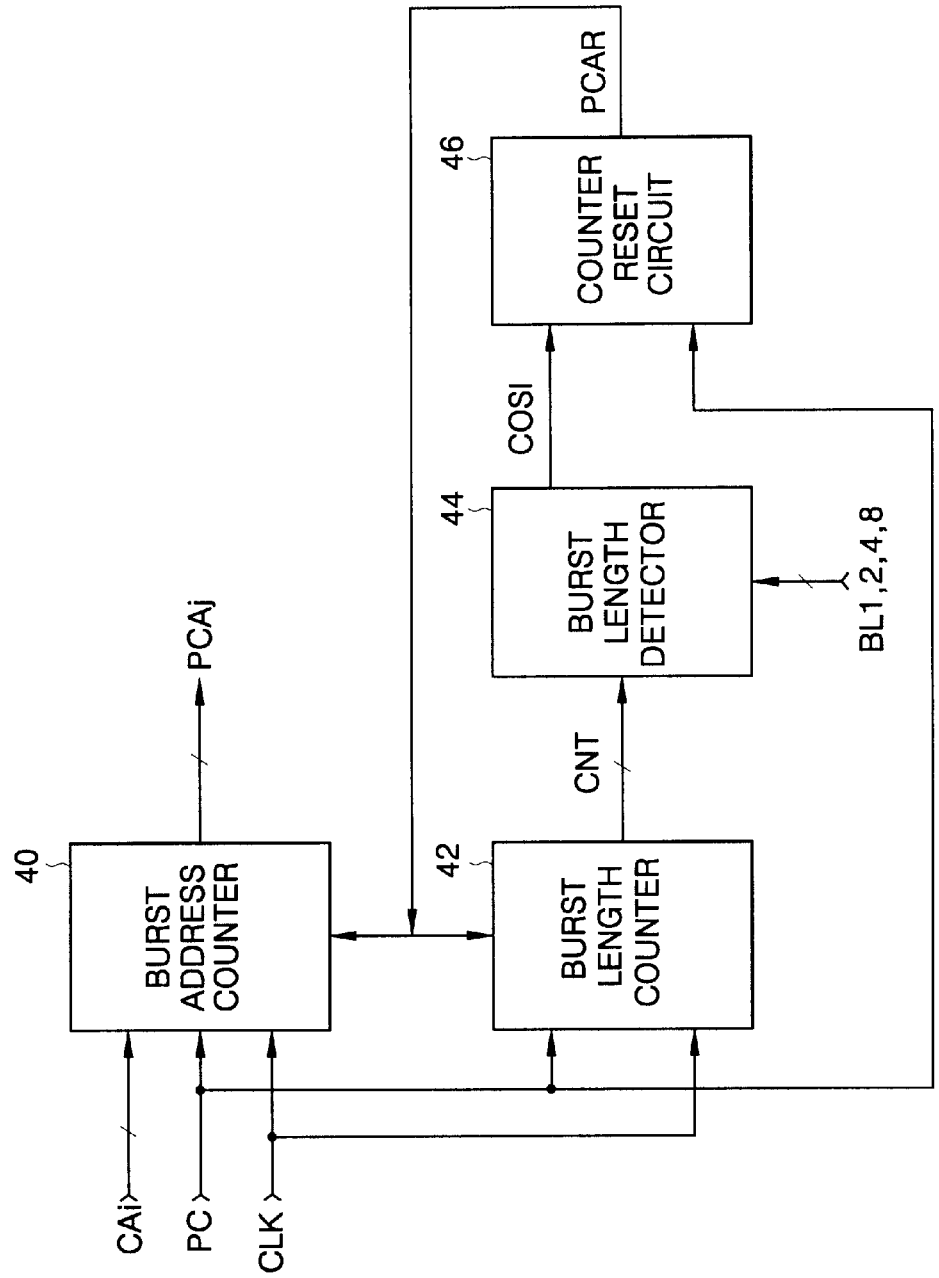
FIG. 2 is a block diagram of an embodiment of a burst address generation circuit shown in FIG. 1.

In the prior burst address generation circuit 26 shown in FIG. 2, the burst address counter 40 and the burst length counter 42 respectively comprise a 3 bit counter to facilitate a burst length of 8. The illustrative burst address generation circuit 26' of the present invention needs only a 2 bit counter to facilitate a burst length fixed at 4. Therefore, the circuit configuration is simplified. Also, the prior burst length detector 44 shown in FIG. 2 is constructed to generate burst length detection signal COSI respectively where burst lengths BL are 1, 2, 4 and 8, but the burst length detector 44' of the present invention needs only to generate a burst length detection signal COSI only where burst length BL is 4. Therefore, the circuit configuration is simplified.

Although not shown, as another embodiment, the burst address generation circuit 26' may be constructed to comprise the burst address counter 40', the burst length counter 42' and the burst length detector 44', and to be reset automatically after the burst address counter 40' and the burst length counter 42' are counted up to the burst length. Advantageously, such configuration of the burst address generation circuit 26' is more simplified.

Figure 10:
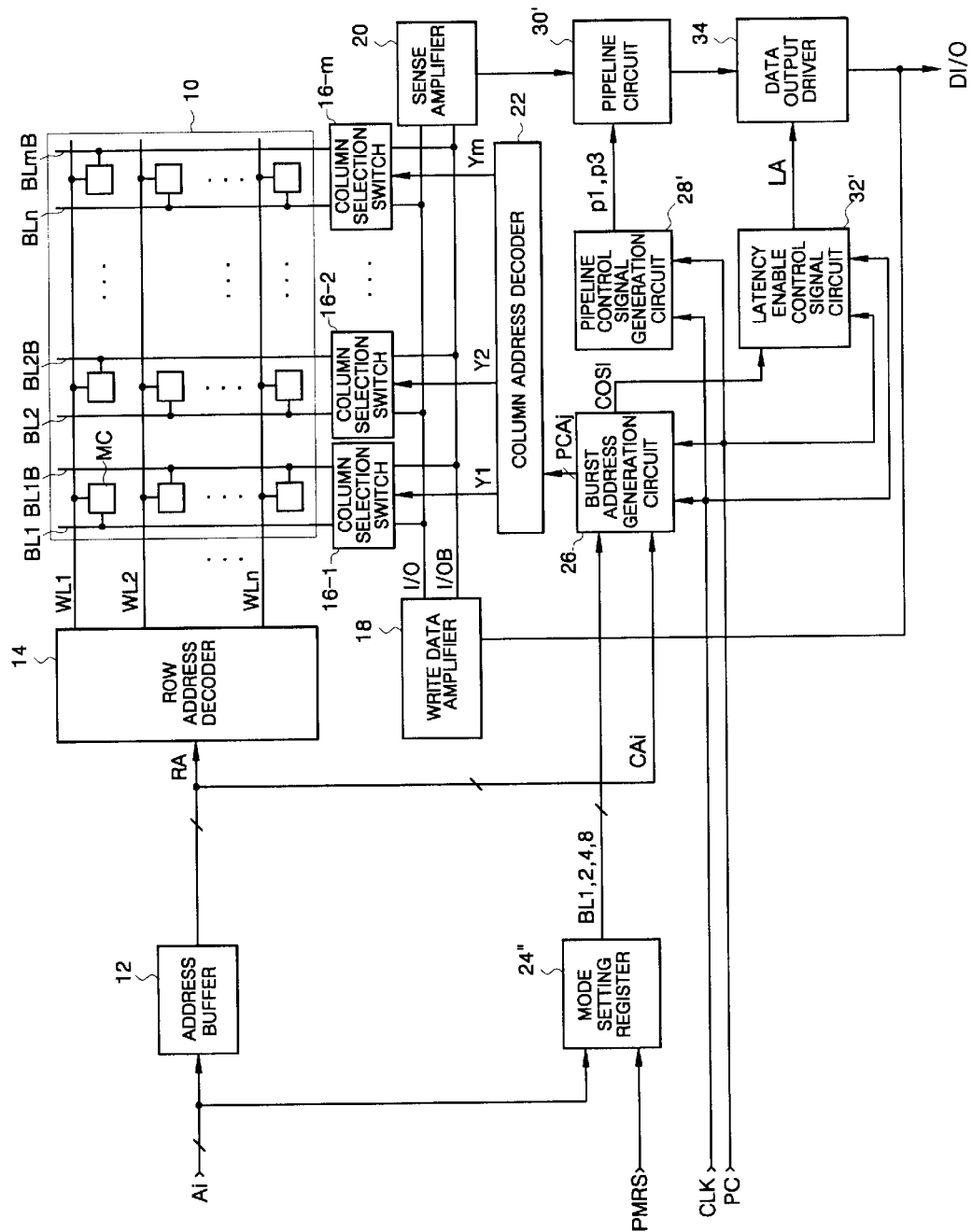
FIG. 10 is a block diagram showing a configuration of another embodiment of a semiconductor memory device of the present invention.

FIG. 10 is a block diagram showing the configuration of another embodiment of the semiconductor memory device of the present invention, wherein the burst length BL is variable and CAS latency is preferably fixed at 2. The circuit configuration of the mode setting register 24", the pipeline control signal generation circuit 28', the pipeline circuit 30', and the latency enable control signal generation circuit 32' of the semiconductor memory device of the present invention shown in FIG. 10 differs from that of the mode setting register 24, the pipeline control circuit 28, the pipeline circuit 30, and the latency enable control signal generation circuit 32 of the semiconductor memory device shown in FIG. 1. And, the configuration of other blocks shown in FIG. 10 is the same as that of blocks having the same numeric designations as the conventional semiconductor memory device shown in FIG. 1.

In FIG. 10, the mode setting register 24" stores a command or signal to set burst length BL with an address Ai in response to the mode setting register control command or signal PMRS. That is, it needs only to store a command or signal applied from the external source to set burst length BL, and there is no need to store a command or signal to set CAS latency CL. Therefore, the circuit configuration composing the mode setting register 24" is simplified.

Figure 3:
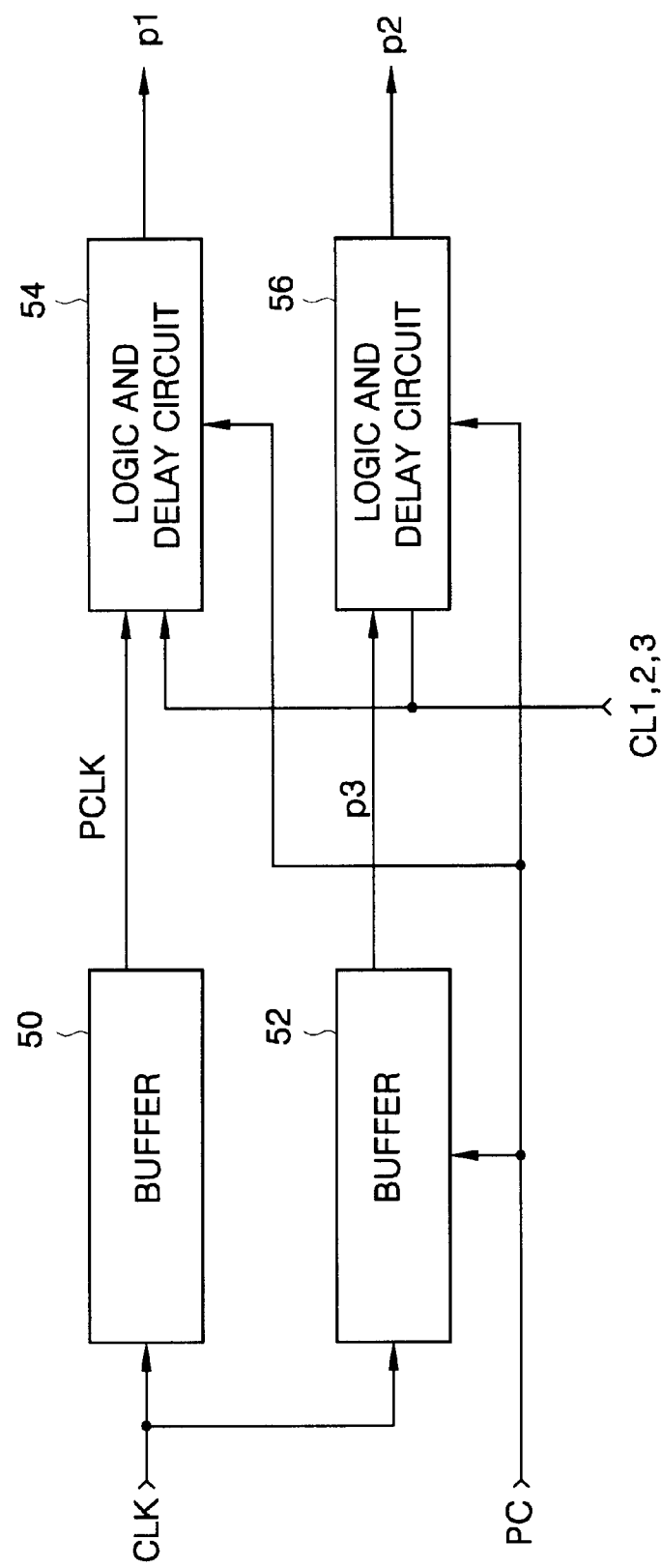
FIG. 3 is a block diagram of an embodiment of a pipeline control signal generation circuit shown in FIG. 1.
Figure 11:
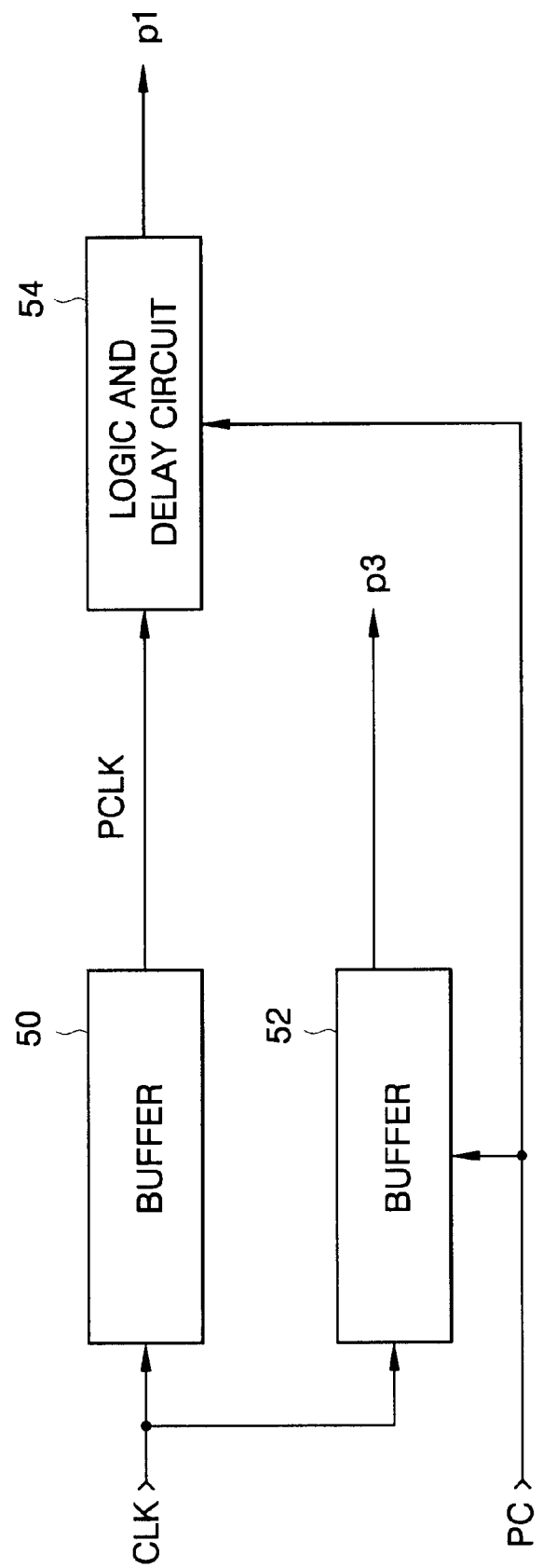
FIG. 11 is a block diagram of an embodiment of a pipeline control signal generation circuit shown in FIG. 10.

FIG. 11 is a block diagram of an embodiment of the pipeline control circuit 28' shown in FIG. 10, which comprises buffers 50 and 52, and a logic and delay circuit 54. The pipeline control circuit 28' shown in FIG. 11 does not include the logic and delay circuit 56 as shown in FIG. 3. The pipeline control circuit 28' needs only to generate pipeline control signals p1 and p3 to perform the operation of latency 2. Therefore, the circuit configuration of the pipeline control circuit 28' is simplified as compared to that of the conventional pipeline control circuit 28 shown in FIG. 3.

Figure 12:
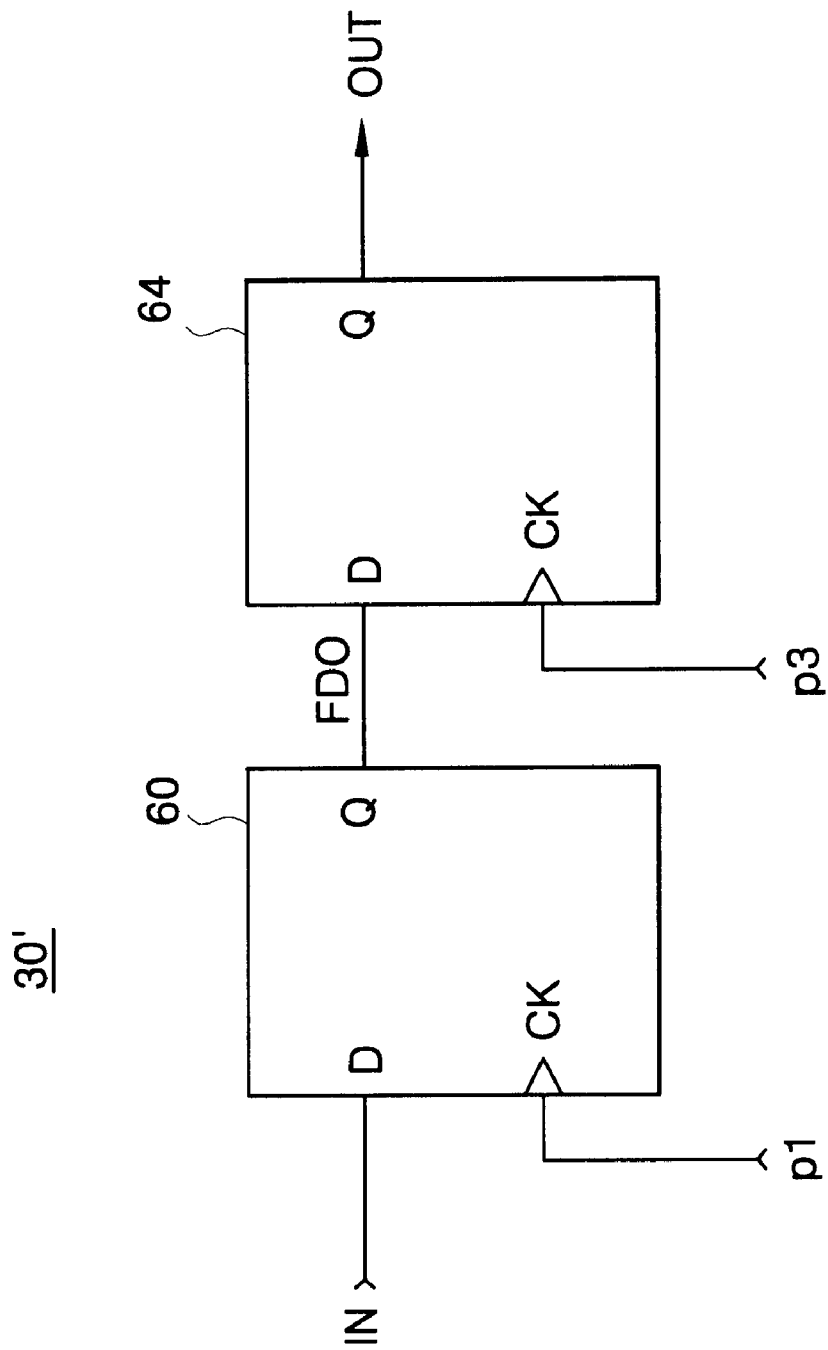
FIG. 12 is a configuration of an embodiment of the pipeline circuit shown in FIG. 10.

FIG. 12 is a configuration of an embodiment of the pipeline circuit 30' shown in FIG. 10, which comprises D flip flops 60 and 64. The pipeline circuit 30' shown in FIG. 12 does not include the D flip flop 62 of the conventional pipeline circuit 30 shown in FIG. 4. The pipeline circuit 30' generates an output signal OUT by delaying the signal IN that is outputted from the sense amplifier 20 in response to the pipeline control signals p1 and p3 to perform the operation of latency 2. Therefore, the circuit configuration of the pipeline circuit 30' is simplified as compared to that of the conventional pipeline circuit 30 shown in FIG. 4.

Figure 13:
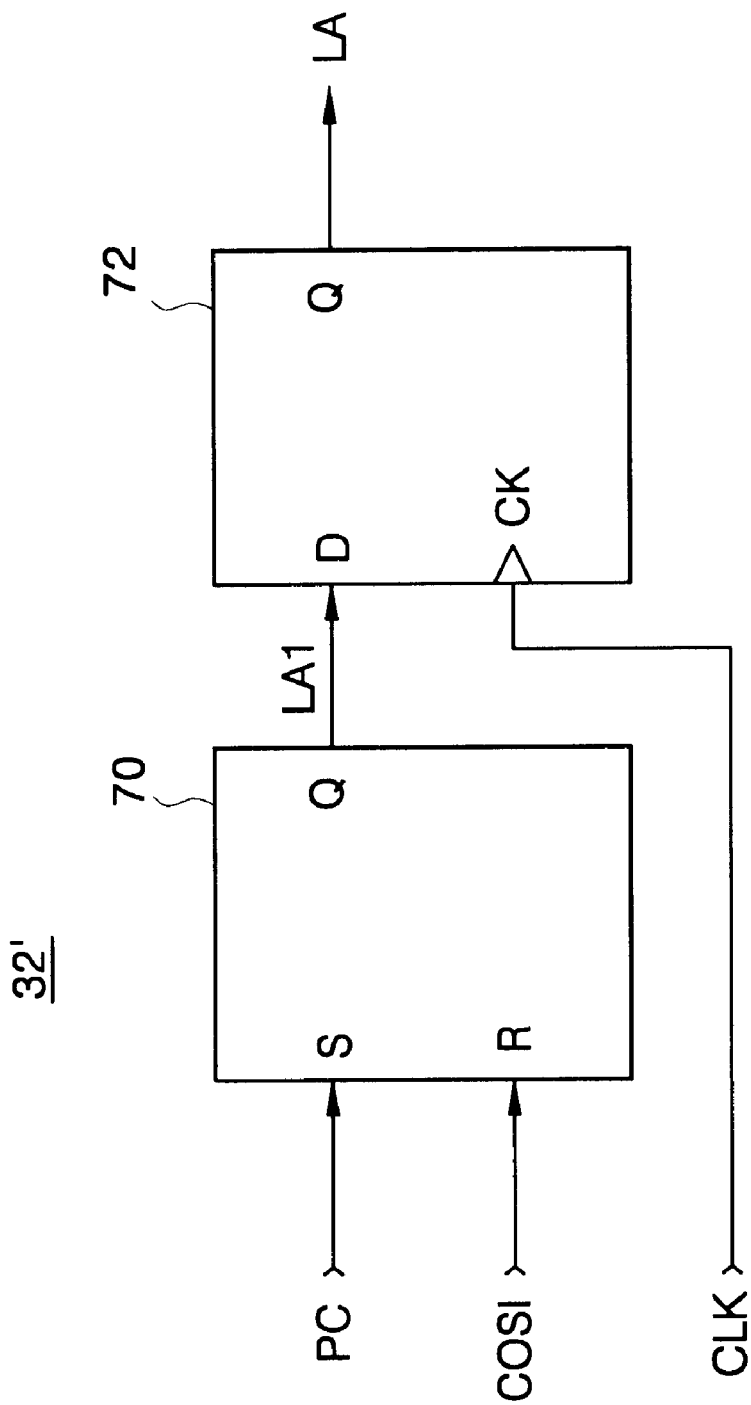
FIG. 13 is a configuration of an embodiment of a latency enable control signal generation circuit shown in FIG. 10.

FIG. 13 is a configuration of an embodiment of the latency enable control signal generation circuit 32' shown in FIG. 10, which comprises a SR latch 70 and a D flip flop 72. The latency enable control signal generation circuit 32' shown in FIG. 13 does not include the D flip flop 74 and the multiplexer 76 of the conventional latency enable control signal generation circuit 32 shown in FIG. 5. The latency enable control signal generation circuit 32' generates a latency enable control signal LA by delaying a first latency signal LA1 one cycle in response to the clock signal CLK to perform the operation of latency 2. Therefore, the circuit configuration of the latency enable control signal generation circuit 32' is simplified as compared to that of the conventional latency enable control signal generation circuit 32 shown in FIG. 5.

Figure 4:
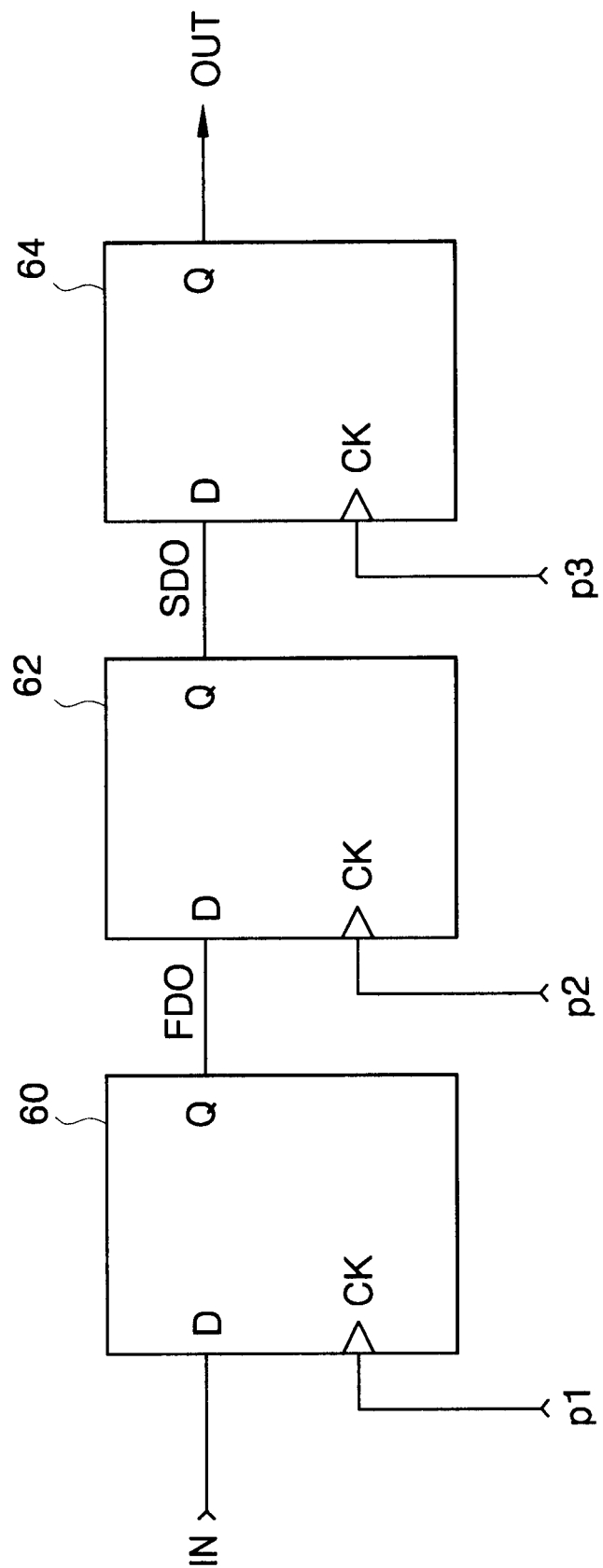
FIG. 4 is a configuration of an embodiment of a pipeline circuit shown in FIG. 1.
Figure 5:
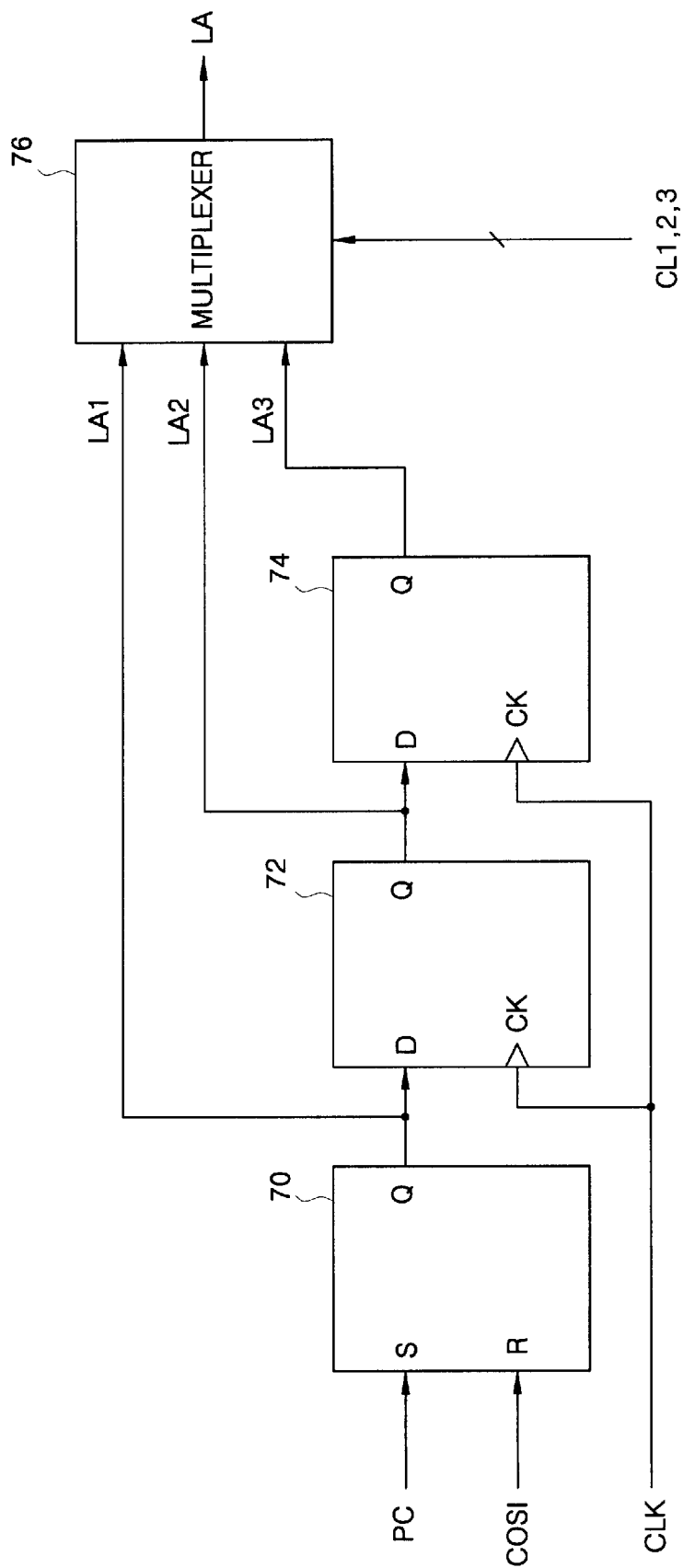
FIG. 5 is a configuration of an embodiment of a latency enable control signal generation circuit shown in FIG. 1.
Figure 6:
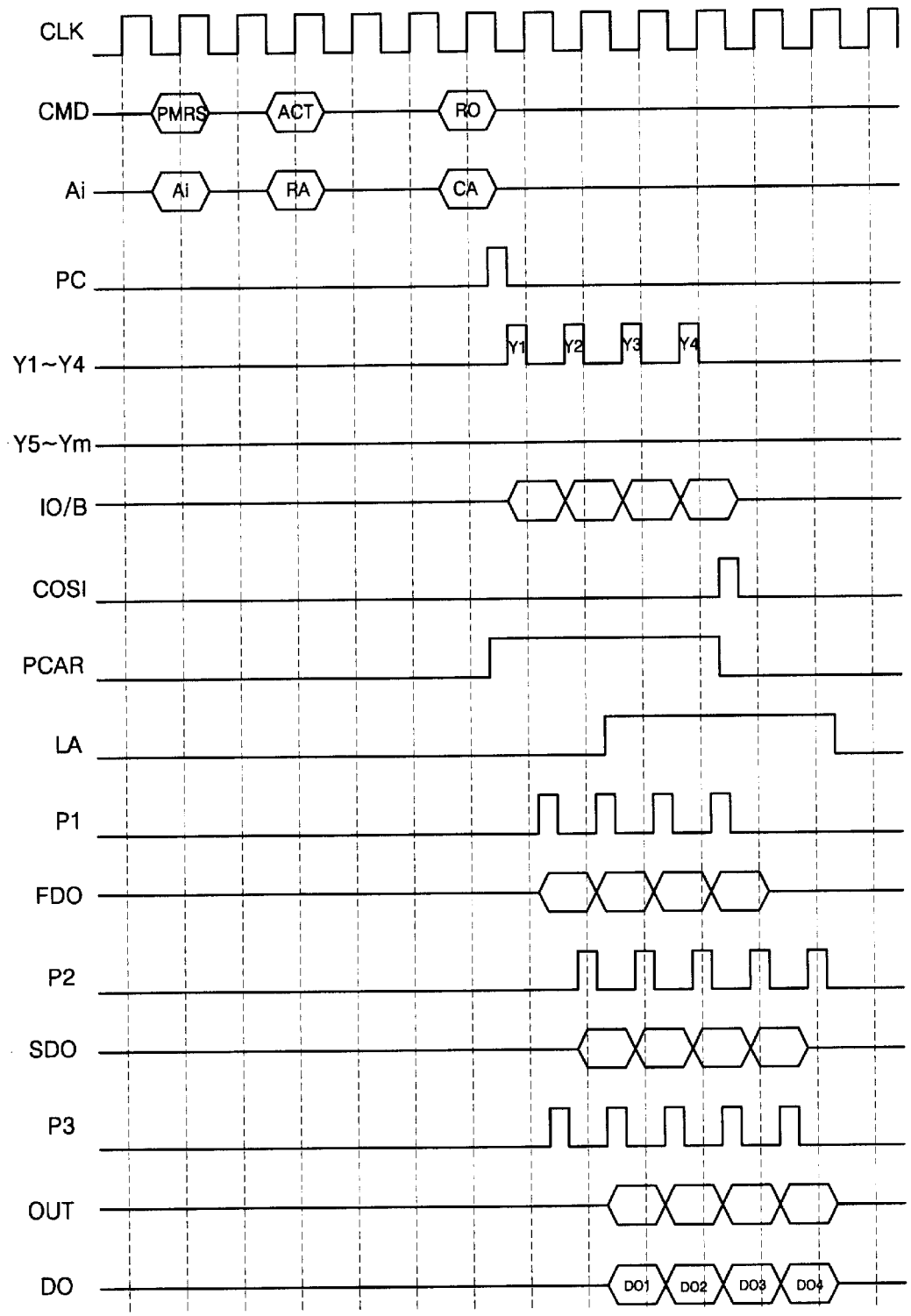
FIG. 6 is an operation timing diagram to illustrate the operation of an embodiment of a semiconductor memory device shown in FIG. 1.
Figure 7:
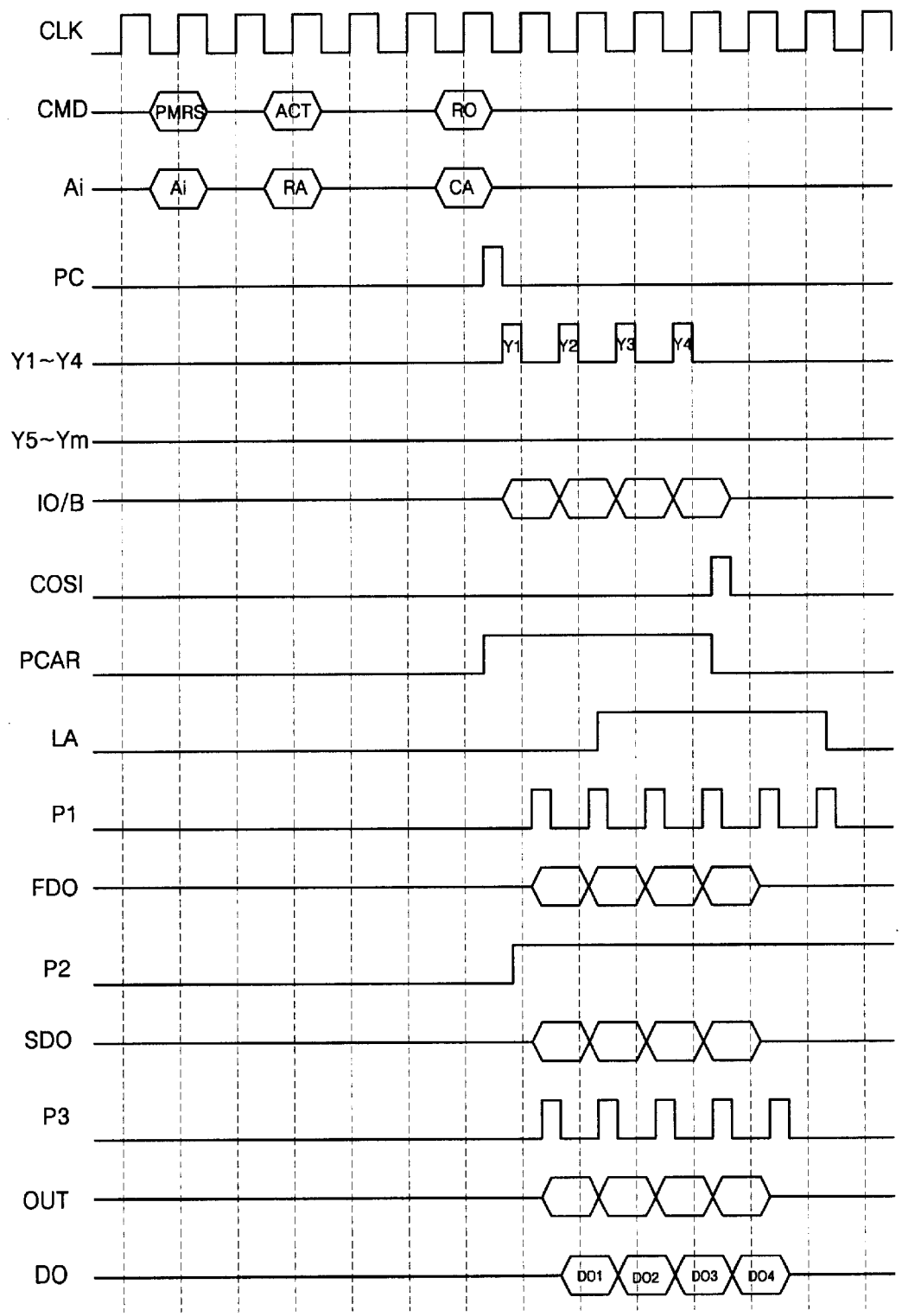
FIG. 7 is an operation timing diagram to illustrate the operation of another embodiment of a semiconductor memory device shown in FIG. 1.

It is noted that in case latency of the semiconductor memory device is fixed at 3, the configuration of the pipeline control signal generation circuit 28' and the pipeline circuit 30' is the same as that of the pipeline control signal generation circuit 28 shown in FIG. 3 and the pipeline circuit 30 shown in FIG. 4. And also the configuration of the latency enable control signal generation circuit 32' does not include the multiplexer 76 in the control signal generation circuit 32 as shown in FIG. 5. Therefore, in case latency of the semiconductor memory device is fixed at 3, the circuit configuration is simplified as compared to that of the conventional semiconductor memory device.

Figure 14:
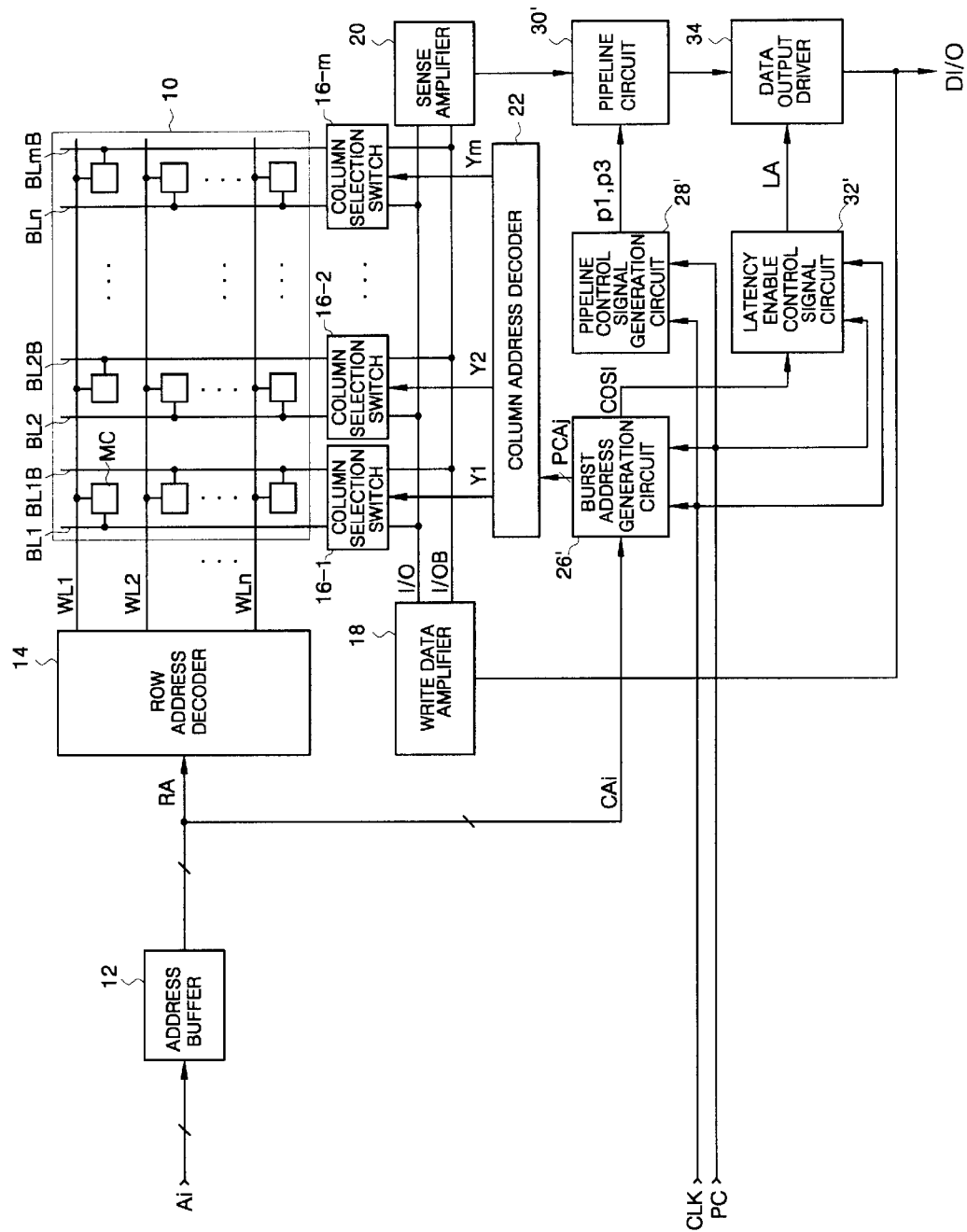
FIG. 14 is a block diagram showing a configuration of another embodiment of the semiconductor memory device of the present invention.

FIG. 14 is a block diagram showing the configuration of another embodiment of the semiconductor memory device of the present invention, wherein CAS latency is fixed at 2 and burst length at 4. The circuit configuration of the burst address generation circuit 26', the pipeline control circuit 28', the pipeline circuit 30' and the latency enable control signal generation circuit 32' of the semiconductor memory device of the present invention differs from that of the burst address generation circuit 26, the pipeline control circuit 28, the pipeline circuit 30 and the latency enable control signal generation circuit 32 of the conventional semiconductor memory device shown in FIG. 1. One difference is that the device of FIG. 14 does not include the mode setting register 24 as shown in FIG. 1. And, the configuration of other blocks shown in FIG. 10 is the same as that of blocks having the same numeric designations as the conventional semiconductor memory device shown in FIG. 1.

In FIG. 14, a semiconductor memory device of the present invention does not use the mode setting register 24 to set CAS latency CL and burst length BL. The configuration of each of the burst address generation circuit 26', the pipeline control circuit 28', the pipeline circuit 30' and the latency control circuit 32' has the same circuit configuration as those shown in FIGS. 9, 11, 12 and 13. Therefore, the circuit configuration is simplified as compared to that of the prior semiconductor memory device shown in FIG. 1.

According to preferred embodiment of the semiconductor memory device of the present invention, there is no need to input CAS latency CL and burst length BL information from the external source and the circuit configuration is simplified by fixing CAS latency CL and burst length BL. While the present invention has been described with respect to particular embodiments, it will be apparent to those skilled in the art that various changes and modifications may be made without departing from the spirit and scope of the invention as defined in the following claims.

What is claimed is:

1. A semiconductor memory device having a fixed burst length and a fixed CAS (column address strobe) latency, comprising:

a memory cell array;

burst address generation means to generate a burst address and a burst length detection signal according to a fixed burst length;

pipeline means to delay and output data read from the memory cell array according to a fixed CAS latency;

latency enable control signal generation means to generate a latency enable control signal according to the fixed CAS latency in response to a read command and the burst length detection signal; and data output means to output data being output from the pipeline means in response to said latency enable control signal, wherein said burst address generation means generates burst addresses according to the fixed burst length, and wherein the fixed CAS latency is n (where n is a integer) cycles of an external clock signal.

2. The semiconductor memory device according to claim 1, wherein said burst address generation means comprises:

a burst address counter which is enabled in response to said read command to generate burst addresses having said fixed burst length by counting from an input address;

a burst length counter to count said fixed burst length; and burst length detection and reset means to generate said burst length detection signal for the fixed burst length in response to output signals of said burst length counter, and to reset said burst address counter and said burst length counter.

3. The semiconductor memory device according to claim 1, wherein said pipeline means comprises:

pipeline control signal generation means to generate pipeline control signals in response to said clock signal; and pipeline means to output data read from said memory cell array in response to each of said pipeline control signals to perform a fixed latency operation.

4. The semiconductor memory device according to claim 3, wherein said pipeline control signal generation means generates n pipeline control signals in response to said clock signal.

5. The semiconductor memory device according to claim 4, wherein said pipeline means comprises first n cascaded flip flops to output said read data in response to each of the n pipeline control signals.

6. The semiconductor memory device according to claim 1, wherein said latency enable control signal generation means comprises:
- a flip flop to generate a latency signal which is enabled in response to said read command and which is disabled in response to said burst length detection signal; and
- n−1 cascaded flip flop(s) to generate said latency signal in response to said clock signal by delaying said latency signal n−1 clock cycle(s).

7. A semiconductor memory device having a variable burst length and a fixed CAS (column address strobe) latency, comprising:
- a memory cell array;
- a mode setting register to store a mode setting command that indicates one of variable burst lengths and to generate a burst length control signal in response to the mode setting command;
- burst address generation means to generate a burst address and a burst length detection signal according to one of the variable burst lengths as specified by said burst length control signal;
- pipeline means to delay and output data read from said memory cell array according to a fixed CAS latency;
- latency enable control signal generation means to generate a latency enable control signal for the fixed CAS latency in response to a read command and said burst length detection signal; and
- data output means to output data being output from said pipeline means in response to said latency enable control signal, wherein the fixed CAS latency is n (where n is an integer) cycles of an external clock signal.

8. The semiconductor memory device according to claim 7, wherein said burst address generation means comprises:
- burst address counting means which is enabled in response to said read command to generate burst addresses having the selected variable burst length, by counting from an address;
- burst length counting means to count the selected burst length;
- burst length detection means to generate said burst length detection signal by receiving said burst length control signal and an output signal of said burst length counting means; and
- reset means to reset said burst address counting means and said burst length counting means in response to said burst length detection signal.

9. The semiconductor memory device according to claim 7, wherein said pipeline means comprises:
- pipeline control signal generation means to generate pipeline control signals in response to said clock signal; and
- pipeline means to output data read from said memory cell array in response to each of said pipeline control signals to perform a fixed latency operation.

10. The semiconductor memory device according to claim 9, wherein said pipeline control signal generation means generates n pipeline control signals in response to said clock signal.

11. The semiconductor memory device according to claim 10, wherein said pipeline means comprises first n cascaded flip flops to output said read data in response to each of the n pipeline control signals.

12. The semiconductor memory device according to claim 7, wherein said latency enable control signal generation means comprises:
- a flip flop to generate a latency signal which is enabled in response to said read command and which is disabled in response to said burst length detection signal; and
- n−1 cascaded flip flop(s) to generate said latency signal in response to said clock signal by delaying said latency enable signal n−1 clock cycles.

13. A semiconductor memory device having a fixed burst length and a variable CAS (column address strobe) latency, comprising:
- a memory cell array;
- a mode setting register to store a mode setting command that indicates one of variable CAS latencies and to generate a latency control signal in response to the mode setting command;
- a burst address generator to generate a burst address and a burst length detection signal according to a fixed burst length;
- a pipeline circuit to delay and output data read from said memory cell array according to a selected one of the variable CAS latencies as specified by said latency control signal;
- a latency enable control signal generator to generate a latency enable control signal in response to a read command, said burst length detection signal and said latency control signal; and
- a data output circuit for outputting data from said pipeline circuit according to the selected one of the variable CAS latencies in response to said latency enable control signal.

14. The semiconductor memory device according to claim 13, wherein said burst address generator comprises:
- a burst address counter which is enabled in response to said read command to generate burst addresses having said fixed burst length by counting from an input address;
- a burst length counter to count said fixed burst length; and
- a burst length detection and reset circuit to generate said burst length detection signal for the fixed burst length in response to output signals of said burst length counter and to reset said burst address counter and said burst length counter.

15. The semiconductor memory device according to claim 13, wherein said pipeline circuit comprises:
- a pipeline control signal generator to generate pipeline control signals in response to said clock signal; and
- pipeline means to output data read from said memory cell array in response to each of said pipeline control signals to perform a selected one of variable CAS latency operations.

16. The semiconductor memory device according to claim 15, wherein said pipeline means comprises a fixed number of cascaded first flip flops to output said read data in response to each of the pipeline control signals.

17. The semiconductor memory device according to claim 15, wherein said latency enable control signal generator comprises:
- a flip flop to generate a first latency signal which is enabled in response to said read command and is disabled in response to said burst length detection signal;
- a fixed number of cascaded flip flops to generate a fixed number of second latency signals in response to said clock signal by delaying said first latency signal a fixed number of clock cycles; and a selector to generate one of said first latency signal and said fixed number of second latency signals as said latency enable control signal in response to said latency control signal.

* * * * *